United States Patent
Lee et al.

(10) Patent No.: US 9,184,096 B2
(45) Date of Patent: Nov. 10, 2015

(54) SEMICONDUCTOR STRUCTURE AND MANUFACTURING METHOD FOR THE SAME

(71) Applicant: MACRONIX INTERNATIONAL CO., LTD., Hsinchu (TW)

(72) Inventors: Guan-Ru Lee, Kaohsiung (TW); Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 200 days.

(21) Appl. No.: 13/798,275

(22) Filed: Mar. 13, 2013

(65) Prior Publication Data
US 2014/0264621 A1    Sep. 18, 2014

(51) Int. Cl.
| H01L 21/44 | (2006.01) |
| H01L 21/4763 | (2006.01) |
| H01L 21/8238 | (2006.01) |
| H01L 27/115 | (2006.01) |

(52) U.S. Cl.
CPC .. *H01L 21/823878* (2013.01); *H01L 27/11531* (2013.01); *H01L 27/11573* (2013.01); *H01L 27/11556* (2013.01); *H01L 27/11582* (2013.01)

(58) Field of Classification Search
CPC . H01L 21/048; H01L 21/475; H01L 21/8238; H01L 21/76802; H01L 21/762; H01L 21/3105; H01L 27/0922
USPC ......... 438/637, 270, 700, 199, 294, 296, 297, 438/551, 553, 555, 636, 692; 257/E21.006, 257/E21.027, E21.058, E21.061, E21.231, 257/E21.267, E21.304, E21.545, E21.546, 257/E21.632
See application file for complete search history.

(56) References Cited

U.S. PATENT DOCUMENTS

| 7,015,082 B2 * | 3/2006 | Doris et al. | 438/153 |
| 7,517,816 B2 * | 4/2009 | Frohberg et al. | 438/783 |
| 7,691,698 B2 * | 4/2010 | Chidambarrao et al. | 438/199 |
| 7,692,303 B2 | 4/2010 | Watanabe | |
| 7,960,237 B2 * | 6/2011 | Chidambarrao et al. | 438/300 |
| 8,951,876 B2 * | 2/2015 | Chou et al. | 438/303 |
| 2007/0178634 A1 | 8/2007 | Jung et al. | |

FOREIGN PATENT DOCUMENTS

TW    200809984 A    2/2008

OTHER PUBLICATIONS

TW Office Action dated Jul. 29, 2015 in corresponding application (No. 102108389).

* cited by examiner

*Primary Examiner* — David Nhu
(74) *Attorney, Agent, or Firm* — McClure, Qualey & Rodack, LLP

(57) ABSTRACT

A semiconductor structure and a manufacturing method for the same are provided. The method includes following steps. A first gate structure is formed on a substrate in a first region. A protecting layer is formed covering the first gate structure. A second gate structure is formed on the substrate in second region exposed by the protecting layer and adjacent to the first region.

13 Claims, 17 Drawing Sheets

SEMICONDUCTOR STRUCTURE AND MANUFACTURING METHOD FOR THE SAME

BACKGROUND

1. Technical Field

The disclosure relates to a semiconductor structure and a manufacturing method for the same.

2. Description of the Related Art

Along with the advance in semiconductor technology, electronic elements are kept being miniaturized, such that electronic products possess more and more functions when the size remains unchanged or become even smaller. As there are more and more information to be processed, the demand for the memory having larger capacity but smaller size is ever increasing.

Devices in different regions need integrating various manufacturing processes. However, process applying for an expected region would influence the device in the region not expected to be influenced.

SUMMARY

According to one aspect of the present disclosure, a manufacturing method for a semiconductor structure is provided. The method comprises following steps. A first gate structure is formed on a substrate in a first region. A protecting layer is formed covering the first gate structure. A second gate structure is formed on the substrate in second region exposed by the protecting layer and adjacent to the first region.

According to another aspect of the present disclosure, a semiconductor structure is provided. The semiconductor structure comprises a first region, a second region, a substrate, a first gate structure and a second gate structure. The second region is adjacent to the first region. The first gate structure is on the substrate in the first region. The first gate structure comprises at least one layer of a gate electrode film. The second gate structure is on the substrate in the second region. The second gate structure comprises multi layers of gate electrode films. A quantity of the at least one layer of the gate electrode film of the first gate structure is different form a quantity of the multi layers of the gate electrode films of the second gate structure.

The above and other aspects of the disclosure will become better understood with regard to the following detailed description of the non-limiting embodiment(s). The following description is made with reference to the accompanying drawings.

DETAILED DESCRIPTION

FIGS. 1-34 illustrate a manufacturing method for a semiconductor structure according to one embodiment.

Figure 1:
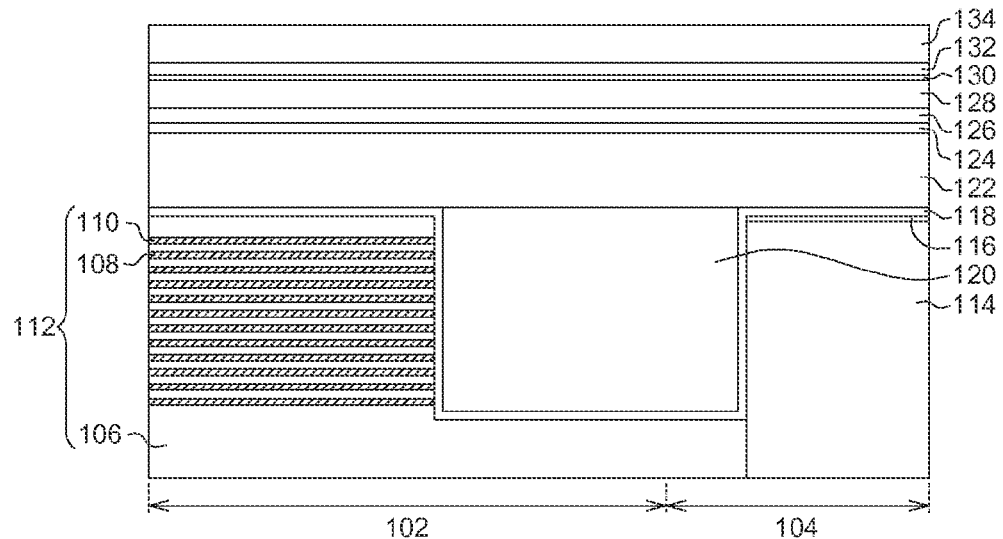
FIGS. 1-34 illustrate a manufacturing method for a semiconductor structure according to one embodiment.

Referring to FIG. 1, in one embodiment, for example, a first region 102 is a 3D memory array region. A second region 104 adjacent to the first region 102 is a periphery region for CMOS.

Referring to FIG. 1, a substrate in the first region 102 may comprise a dielectric layer 106. In one embodiment, the dielectric layer 106 comprises an oxide. In other embodiments, the dielectric layer 106 may be replaced by other suitable material layers such as a semiconductor layer. The semiconductor layer may comprise silicon, etc. Dielectric strips 108 and conductive strips 110 are stacked alternately on the dielectric layer 106 to form a stack structure 112. In one embodiment, the dielectric strips 108 comprise an oxide. In one embodiment, the conductive strips 110 comprise polysilicon.

Referring to FIG. 1, the substrate in the second region 104 may comprise a semiconductor layer 114. In one embodiment, the semiconductor layer 114 comprises silicon. A dielectric layer 116 is formed on the semiconductor layer 114. In one embodiment, the dielectric layer 116 comprises an oxide.

Referring to FIG. 1, a dielectric layer 118 is formed on the stack structure 112, the dielectric layer 106 and the dielectric layer 116 on the semiconductor layer 114. In one embodiment, the dielectric layer 118 comprises a dielectric anti-reflective coating (DARC) layer. For example, the dielectric layer 118 may comprise silicon oxide, silicon nitride, silicon oxynitride or the likes. A dielectric layer 120 is disposed between a sidewall of the stack structure 112 and a sidewall of the semiconductor layer 114. In one embodiment, the dielectric layer 120 comprises an oxide. A sacrificial layer 122 is disposed on the dielectric layer 118 and the dielectric layer 120. In one embodiment, the sacrificial layer 122 comprises a carbon containing film such as SiOC. A sacrificial layer 124 is disposed on the sacrificial layer 122. In one embodiment, the sacrificial layer 124 comprises an oxide (cap oxide). The sacrificial layer 124 may have a thickness of 300 nm. A mask layer 126 is formed on the sacrificial layer 124. In one embodiment, the mask layer 126 comprises polysilicon. The mask layer 126 may have a thickness of 400 nm. A film layer 128 is formed on the mask layer 126. In one embodiment, the film layer 128 comprises an advanced pattern film (APF) (Applied Materials, Inc). The film layer 128 may have a thickness of 800 nm. An anti-reflective layer 130 is disposed on the film layer 128. In one embodiment, the anti-reflective layer 130 comprises DARC. For example, the anti-reflective layer 130 may comprise silicon oxide, silicon nitride, silicon oxynitride or the likes. In one embodiment, the anti-reflective layer 130 has a thickness of 180 nm. An anti-reflective layer 132 is disposed on the anti-reflective layer 130. In one embodiment, the anti-reflective layer 132 comprises a bottom anti-reflective coating (BARC). For example, the anti-reflective layer 132 may comprise an organic material. In one embodiment, the anti-reflective layer 132 has a thickness of 300 nm. A photoresist layer 134 is disposed on the anti-reflective layer 132. In one embodiment, the photoresist layer 134 has a thickness of 1000 nm.

Figure 2:
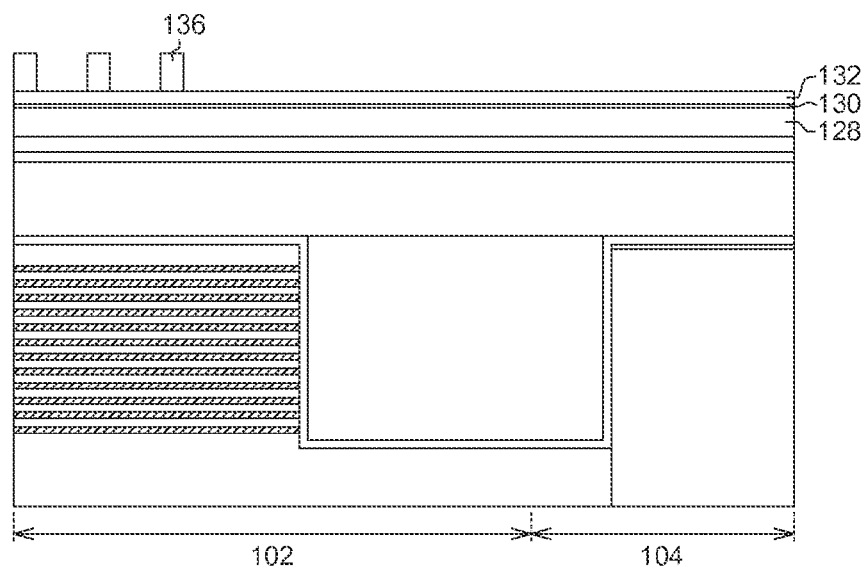

Referring to FIG. 2, the photoresist layer 134 is patterned to form a photoresist pattern 136 on the anti-reflective layer 132.

Figure 3:
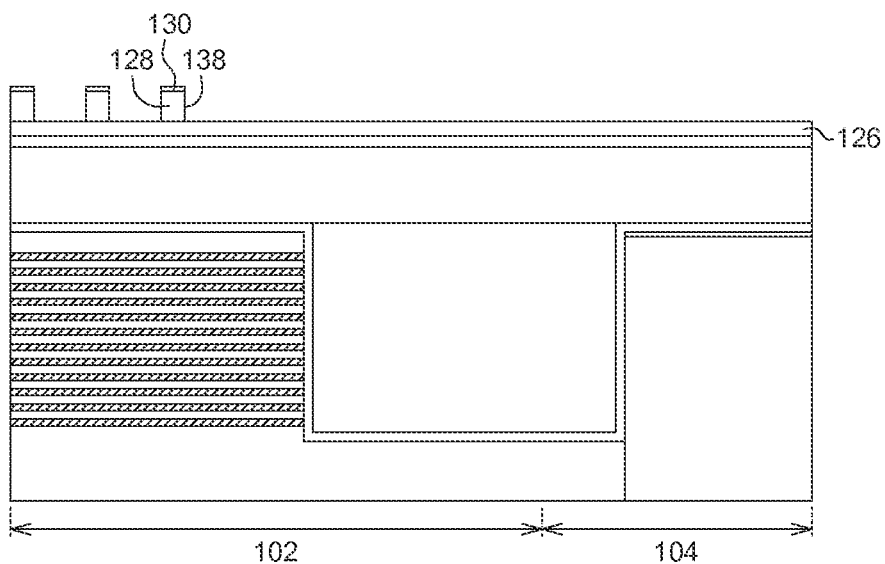

Referring to FIG. 3, a part of the film layer 128 is removed to form a film pattern 138 on the mask layer 126 by an etching step using the photoresist pattern 136 as an etching mask. The film pattern 138 may comprise the etched film layer 128 and the etched anti-reflective layer 130 on the etched film layer 128. The film pattern 138 has openings exposing the mask layer 126.

Figure 4:
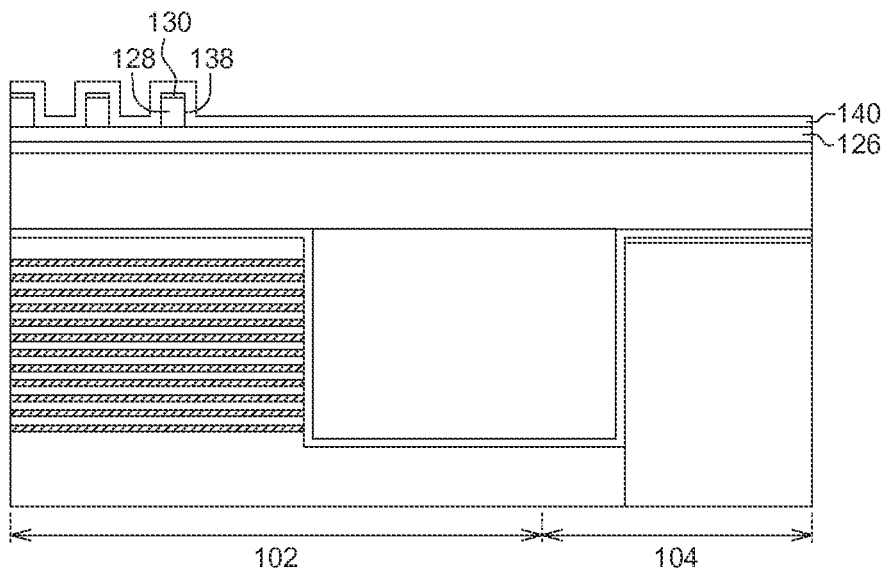

Referring to FIG. 4, a material film 140 is formed on the film pattern 138 and the mask layer 126 exposed by the openings of the film pattern 138. In one embodiment, the material film 140 comprises an oxide.

Figure 5:
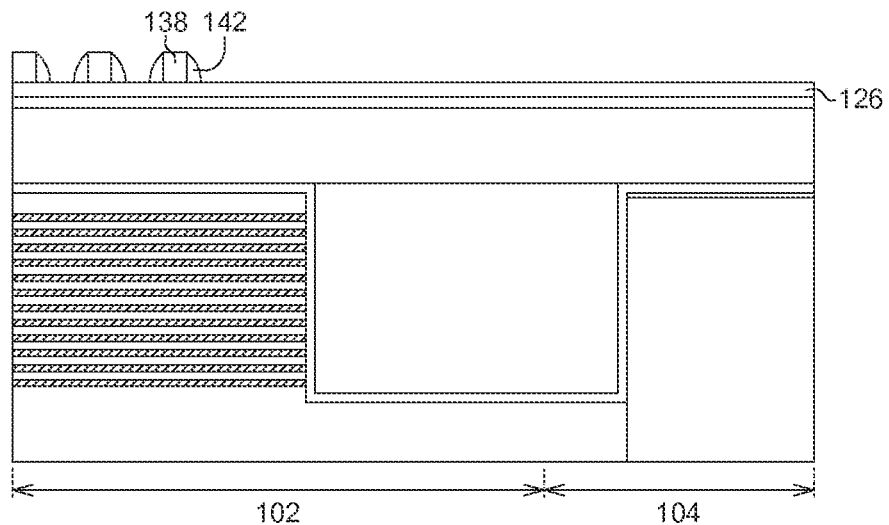

Referring to FIG. 5, a part of the material film 140 is removed by an anisotropic etching step to remain a part of the material film 140 on a sidewall of the film pattern 138 to form a material spacer 142. This etching step also removes the anti-reflective layer 130 of the film pattern 138. In one embodiment, this etching step stops on the mask layer 126 substantially.

Figure 6:
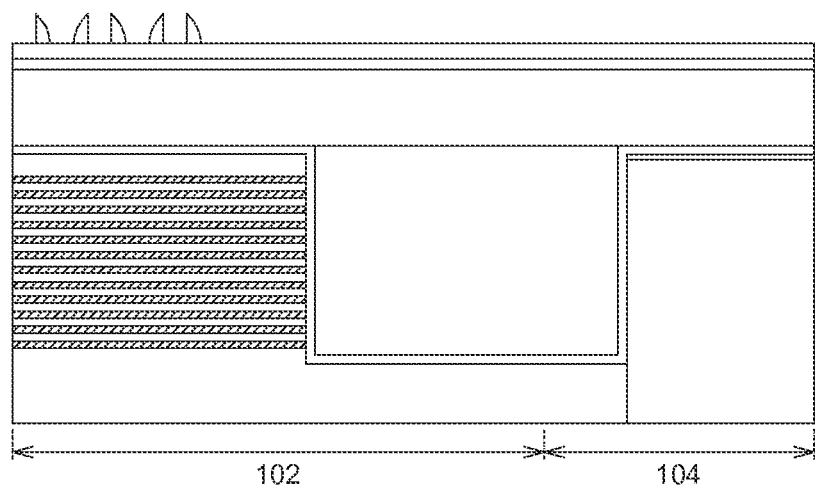

Referring to FIG. 6, the film pattern 138 is removed.

Figure 7:
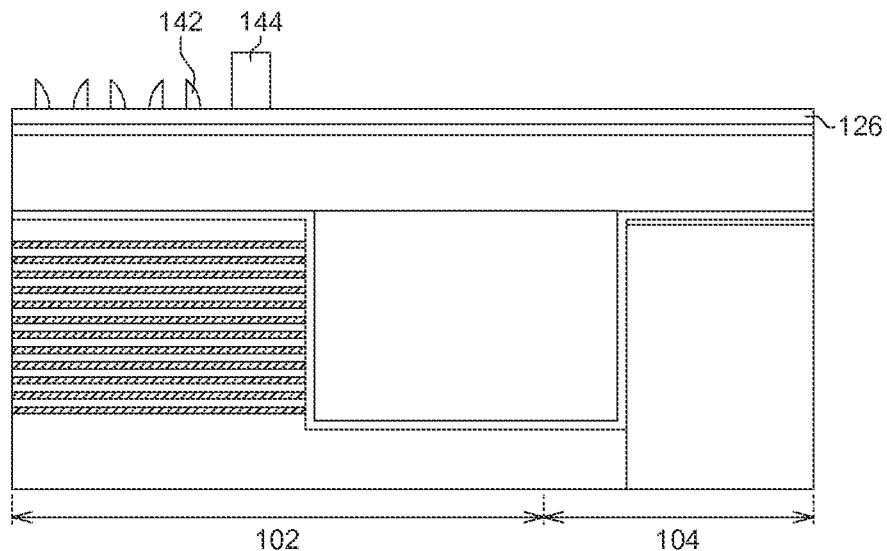

Referring to FIG. 7, a pattern structure 144 is formed on the mask layer 126 in the first region 102. In one embodiment, the pattern structure 144 comprises a photoresist pattern).

Figure 8:
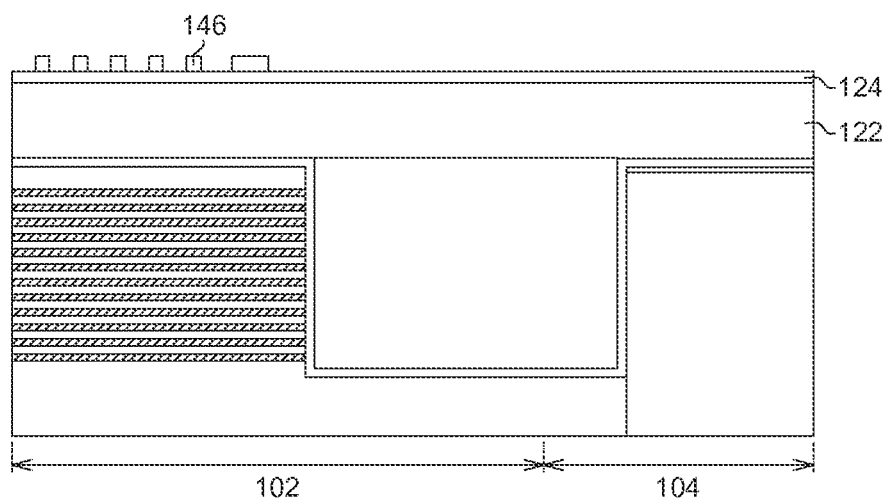

Referring to FIG. 8, a part of the mask layer 126 is removed to form a mask pattern 146 having openings on the sacrificial layer 124 by an etching step using the material spacer 142 and the pattern structure 144 as an etching mask. Then, the material spacer 142 and the pattern structure 144 are removed.

Figure 9:
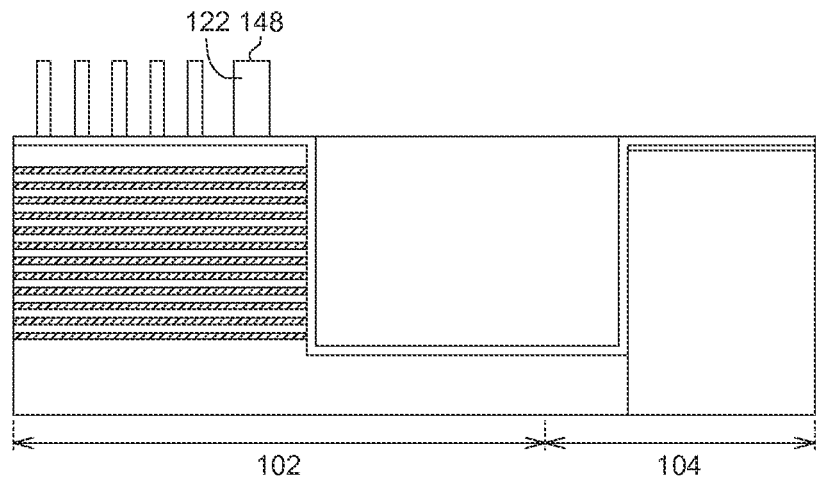

Referring to FIG. 9, the sacrificial layer 124 and a part of the sacrificial layer 122 are removed to form a sacrificial pattern 148 having openings by an etching step using the mask pattern 146 as an etching mask. In one embodiment, after this etching step, the sacrificial pattern 148 may have the remained sacrificial layer 124 on the etched sacrificial layer 122 (not shown).

Figure 10:
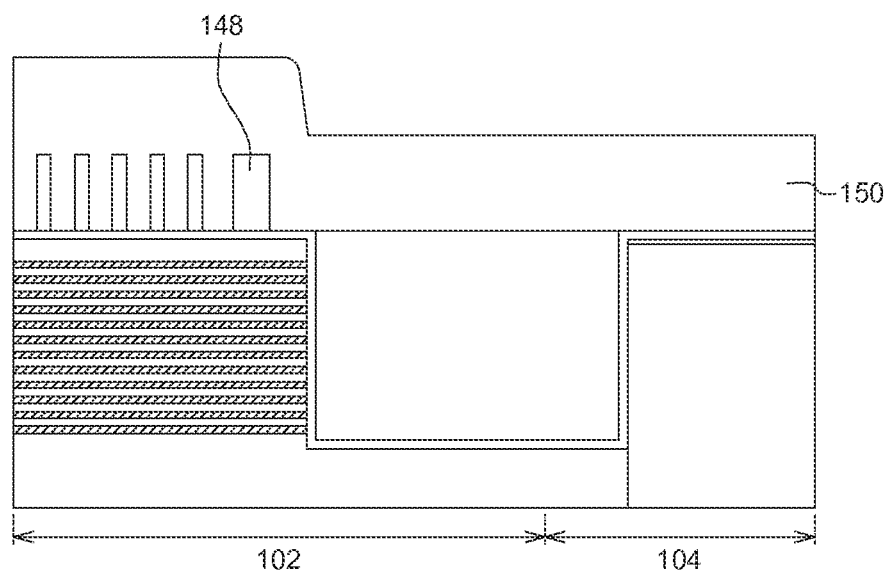

Referring to FIG. 10, the openings of the sacrificial pattern 148 are filled with a material layer 150. In one embodiment, the material layer 150 comprises an oxide.

Figure 11:
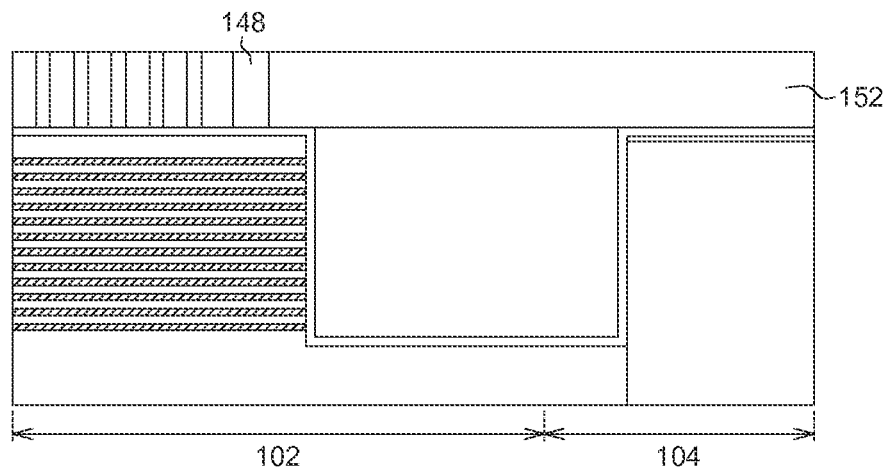

Referring to FIG. 11, an upper portion of the material layer 150 is removed to form a patterned layer 152 exposing the sacrificial pattern 148. The material layer 150 may be removed by a method comprising CMP, an etching back method, or other suitable methods. In one embodiment, this etching step may stop on the sacrificial pattern 148.

Figure 12:
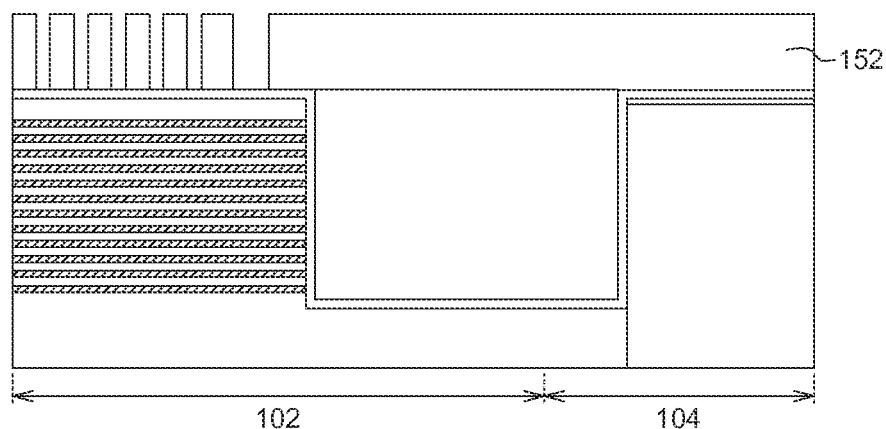

Referring to FIG. 12, the sacrificial pattern 148 is removed so as to remain the patterned layer 152 having openings.

Figure 13:
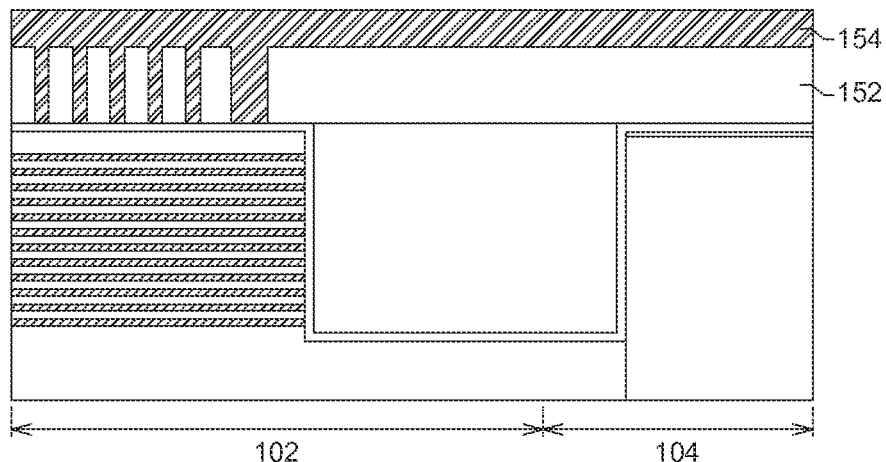

Referring to FIG. 13, the openings of the patterned layer 152 is filled with a conductive layer 154. In one embodiment, the conductive layer 154 comprises polysilicon.

Figure 14:
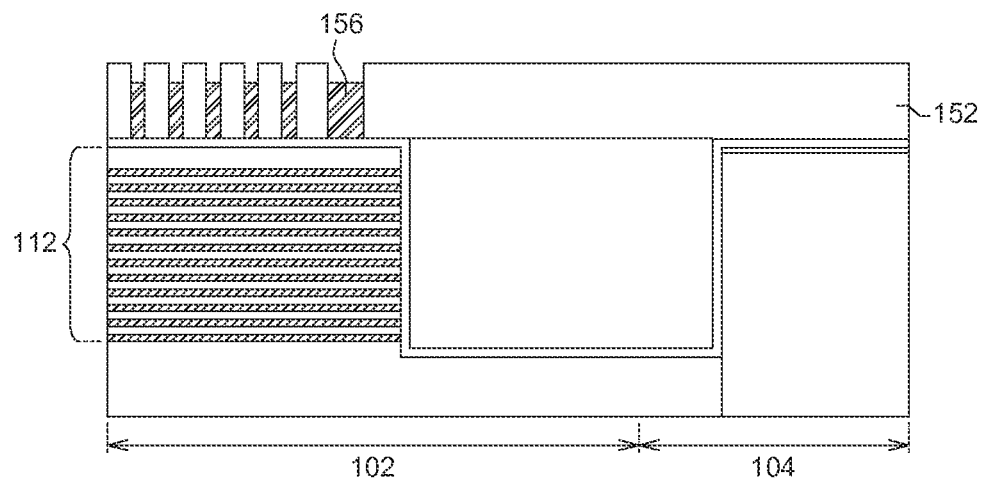

Referring to FIG. 14, an upper portion of the conductive layer 154 is removed to remain a portion of the conductive layer 154 in the openings of the patterned layer 152 to form gate electrode films 156 of gate structures. The gate electrode films 156 of the gate structures are separated from each other. In one embodiment, the conductive layer 154 is a single-layer material film, thus the gate electrode film 156 having the single-layer material film is obtained. However, the present disclosure is not limited thereto. In other embodiments, the conductive layer 154 is a multi-layer material film, thus the gate electrode film 156 having the multi-layer material film is obtained. As the material films of the multi-layer material film are respectively formed by different process parameters, the material films may have a grain boundary therebetween. In one embodiment, the conductive layer 154 may be removed by an etching back method. In other embodiments, the conductive layer 154 may be removed by CMP.

In embodiments, the gate structures (gate electrode films 156) on the stack structure 112 is formed by a damascene process, that is, the gate structures (gate electrode films 156) is formed by forming the patterned layer 152 having the openings that have fine feature size and then filling the openings of the patterned layer 152 with the conductive layer 154.

Figure 15:
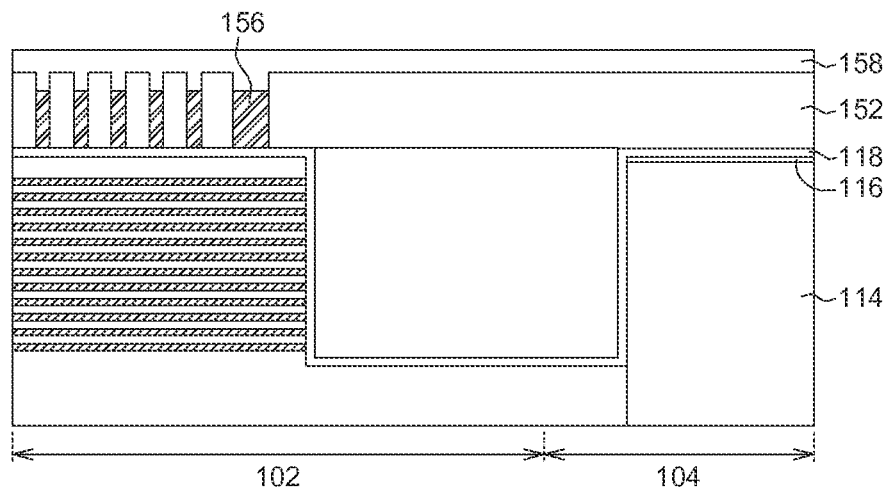

Referring to FIG. 15, a protecting layer 158 is formed on the gate electrode film 156 and the patterned layer 152 so as to protect the elements in the first region 102 from being influenced by processes applied to the second region 104, and preserve the structure characteristics of the gate electrode film 156 (the gate structure). In one embodiment, the protecting layer 158 comprises an oxide.

Figure 16:
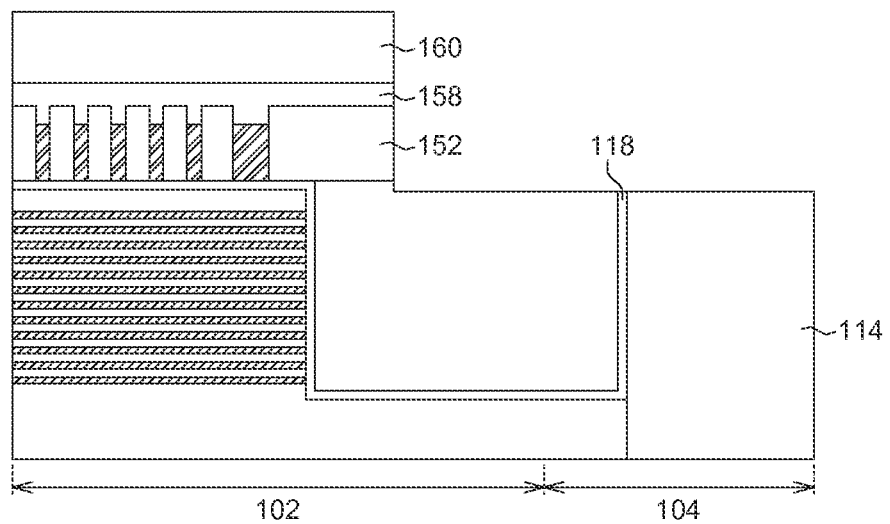

Referring to FIG. 16, a photoresist pattern 160 is formed on the protecting layer 158. A part of the protecting layer 158 in the second region 104 and the dielectric layer 116, the dielectric layer 118 and the patterned layer 152 on the semiconductor layer 114 are removed to expose the semiconductor layer 114 by an etching step using the photoresist pattern 160 as an etching mask. In one embodiment, this etching step substantially stops on the semiconductor layer 114.

Figure 17:
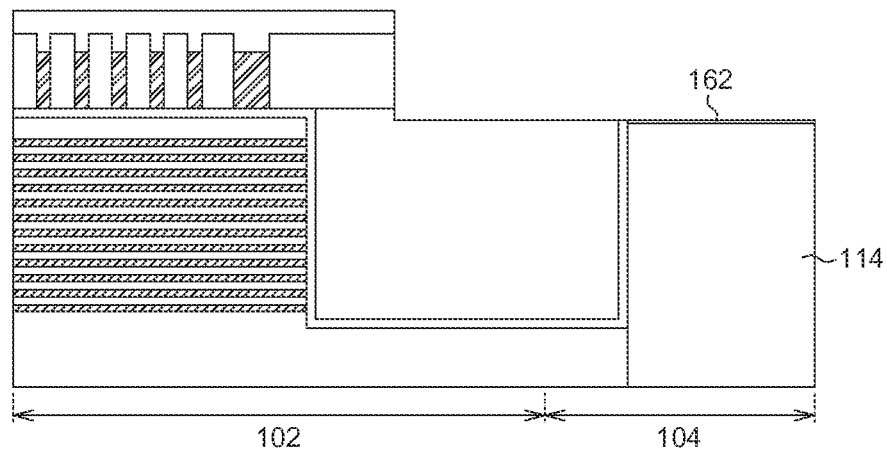

Referring to FIG. 17, a dielectric layer 162 is formed on the semiconductor layer 114. In one embodiment, the dielectric layer 162 comprises an oxide (SAC OX).

Figure 18:
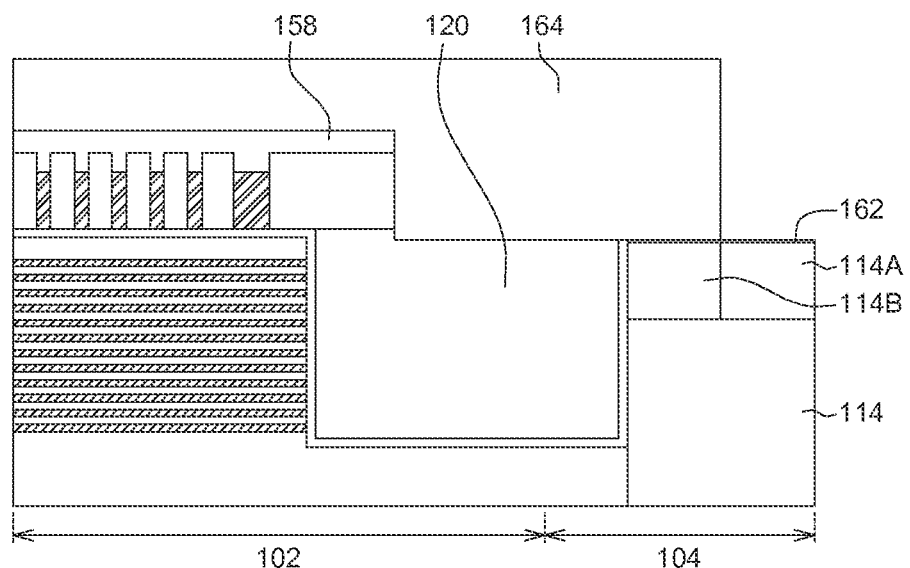

Referring to FIG. 18, a mask pattern 164 is formed on the semiconductor layer 114, the dielectric layer 120, the dielectric layer 162 and the protecting layer 158. In one embodiment, the mask pattern 164 comprises a photoresist material. The semiconductor layer 114 exposed by openings of the mask pattern 164 is doped to form a semiconductor layer 114A. Next, the mask pattern 164 is removed. In other embodiments, another mask pattern (not shown) exposing another region of the semiconductor layer 114 is formed, and the exposed another region of the semiconductor layer 114 is doped to form a semiconductor layer 114B. The semiconductor layer 114A and the semiconductor layer 114B may have different doped conditions. In one embodiment, for example, the semiconductor layer 114A and the semiconductor layer 114B have N-type conductivity and P-type conductivity, respectively.

Figure 19:
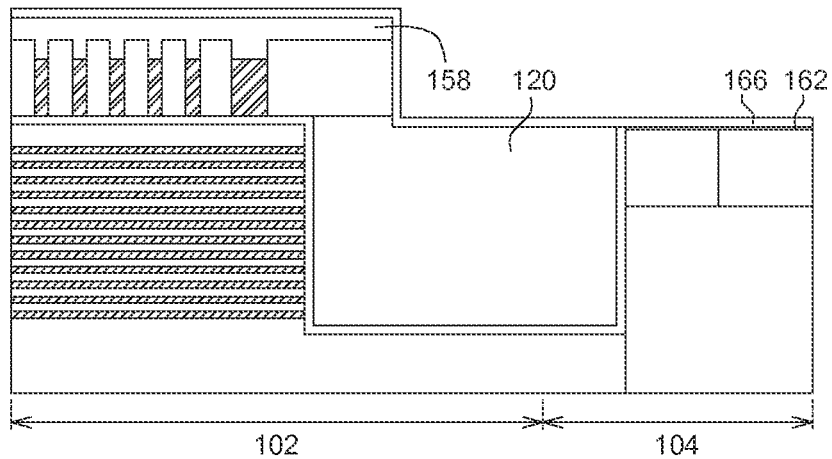

Referring to FIG. 19, a dielectric layer 166 is formed on the dielectric layer 162, the dielectric layer 120 and the protecting layer 158. In one embodiment, the dielectric layer 166 may comprise silicon nitride, silicon oxynitride or the likes (PAD SIN). The dielectric layer 166 may be formed by a method comprising a deposition method or other suitable methods.

Figure 20:
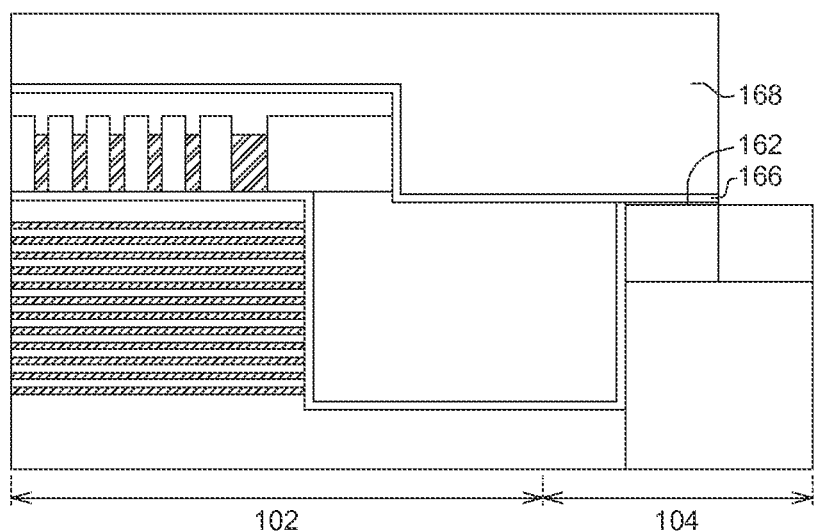

Referring to FIG. 20, a mask pattern 168 is formed on the dielectric layer 166. In one embodiment, the mask pattern 168 comprises a photoresist material. A part of the dielectric layer 162 and the dielectric layer 166 are removed by an etching step using the mask pattern 168 as an etching mask. Next, the mask pattern 168 is removed.

Figure 21:
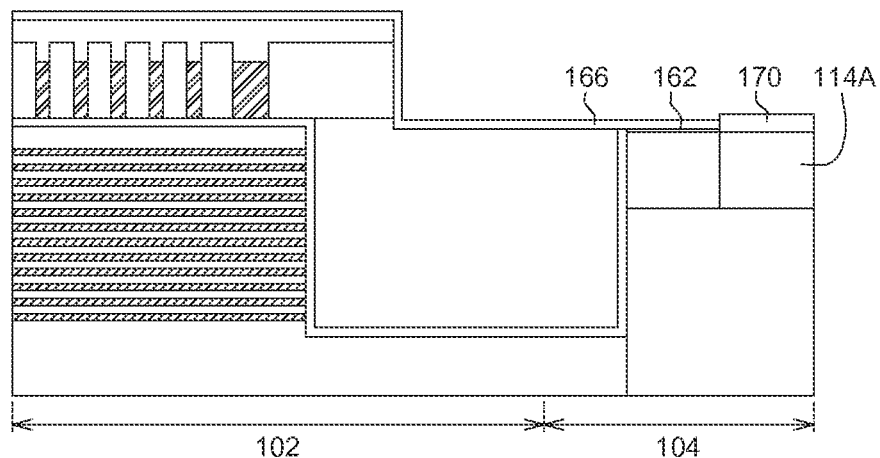

Referring to FIG. 21, a dielectric layer 170 is formed on the semiconductor layer 114A. In one embodiment, the dielectric layer 170 comprises an oxide.

Figure 22:
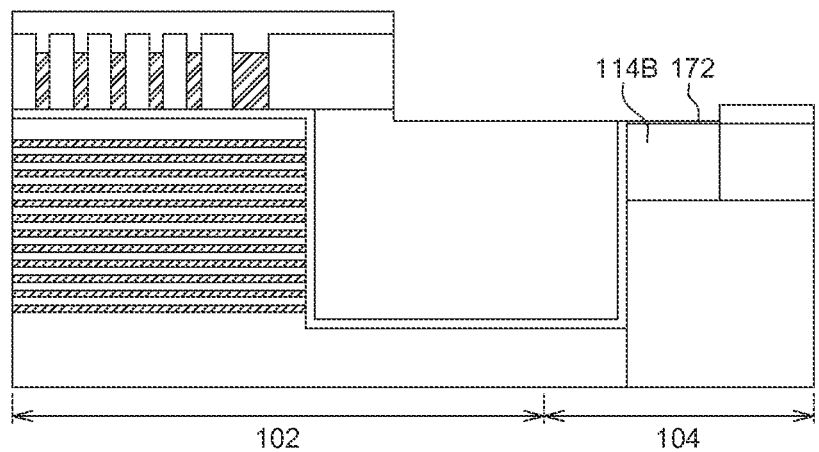

Referring to FIG. 22, after the dielectric layer 162 and the dielectric layer 166 are removed, a dielectric layer 172 is formed on the semiconductor layer 114B. In one embodiment, the dielectric layer 172 comprises an oxide.

Figure 23:
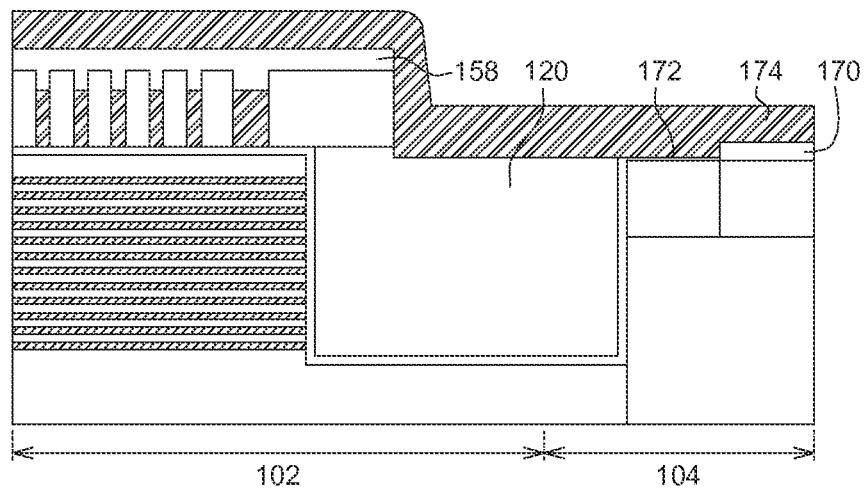

Referring to FIG. 23, an electrode layer 174 is formed on the dielectric layer 120, the dielectric layer 170, the dielectric layer 172 and the protecting layer 158. In one embodiment, the electrode layer 174 comprises polysilicon.

Figure 24:
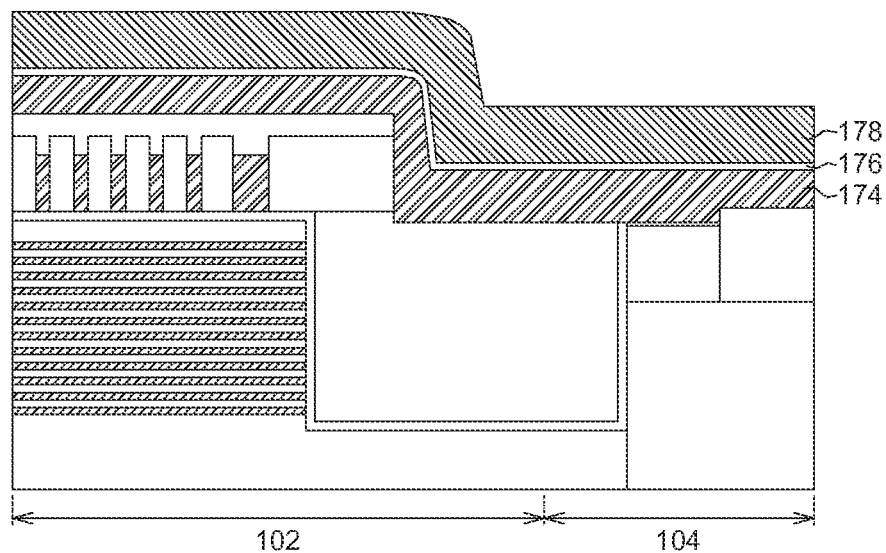

Referring to FIG. 24, a mask layer 176 is formed on the electrode layer 174. In one embodiment, the mask layer 176 comprises an oxide. A mask layer 178 is formed on the mask layer 176. In one embodiment, the mask layer 178 comprises silicon nitride, silicon oxynitride or the likes.

Figure 25:
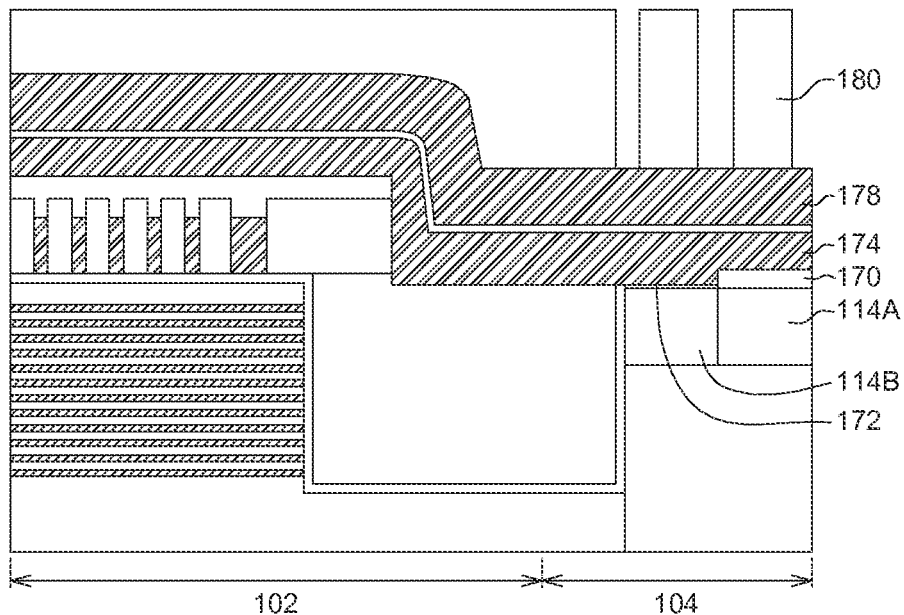

Referring to FIG. 25, a mask pattern 180 is formed on the mask layer 178. In one embodiment, the mask pattern 180 comprises a photoresist material.

Figure 26:
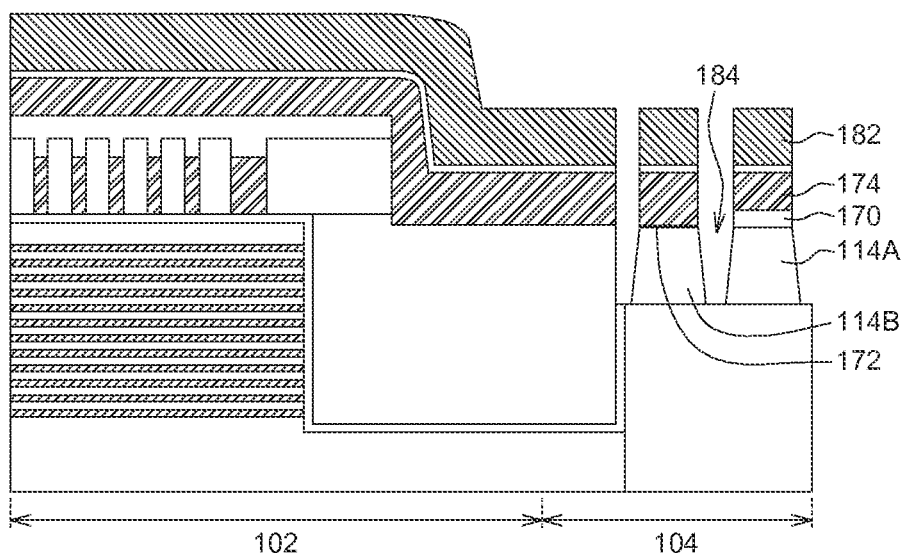

Referring to FIG. 26, the mask layer 178 exposed by the opening of the mask pattern 180 is removed to form a mask pattern 182 by an etching step using the mask pattern 180 as an etching mask. Next, the mask pattern 180 is removed. The electrode layer 174, the dielectric layer 170, the dielectric layer 172, the semiconductor layer 114A and the semiconductor layer 114B under the opening of the mask pattern 182 are removed by an etching step using the mask pattern 182 as an etching mask. The etched electrode layer 174, dielectric layer 170, dielectric layer 172, semiconductor layer 114A and semiconductor layer 114B are separated from each other by a space 184.

Figure 27:
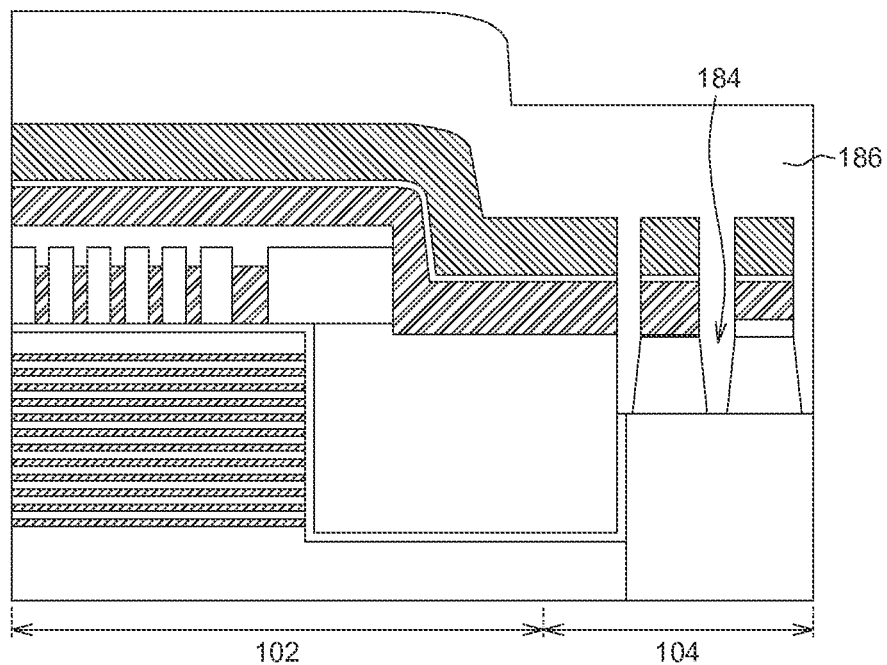

Referring to FIG. 27, the space 184 is filled by an insulating material 186. In one embodiment, the insulating material 186 comprises an oxide.

Figure 28:
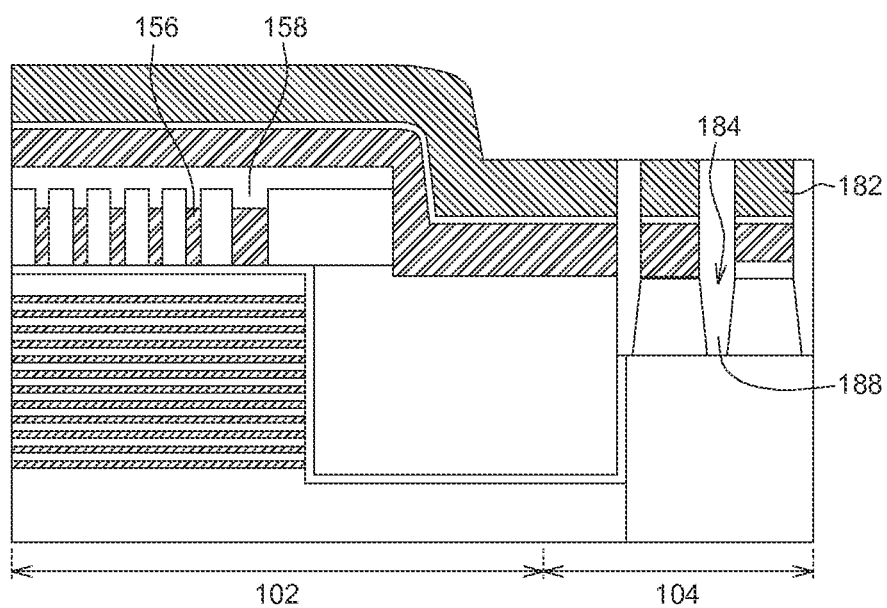

Referring to FIG. 28, a part of the insulating material 186 is removed to remain a part of the insulating material 186 in the space 184 to form an isolation structure 188. The isolation structure 188 is shallow trench isolation (STI). In embodiments, the isolation structure 188 (STI) is formed by a self-aligned method. During the self-aligned STI process, the gate structure (gate electrode film 156) on the first region 102 and formed by a damascene process is protected by the protecting layer 158, therefore the characteristics of the gate structure (gate electrode film 156) are not influenced by the STI process. Therefore, according to the methods in embodiments, it is possible to integrate the damascene process and the STI process and get the elements having good characteristics respectively formed by the damascene process and the STI process. The device can have good electrical characteristics and good efficiency. The yield and efficiency of the product is increased. Next, the mask pattern 182 is removed.

Figure 29:
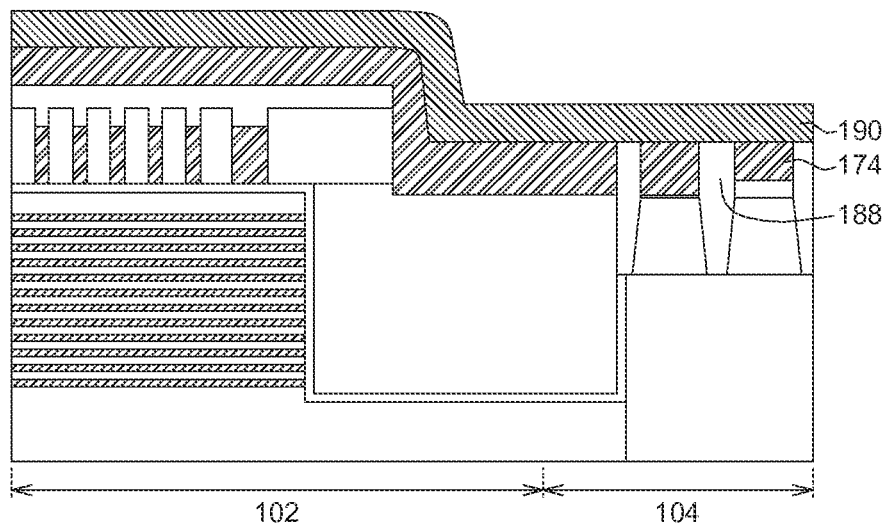

Referring to FIG. 29, an electrode layer 190 is formed on the electrode layer 174 and the isolation structure 188. In one embodiment, the electrode layer 190 comprises polysilicon.

Figure 30:
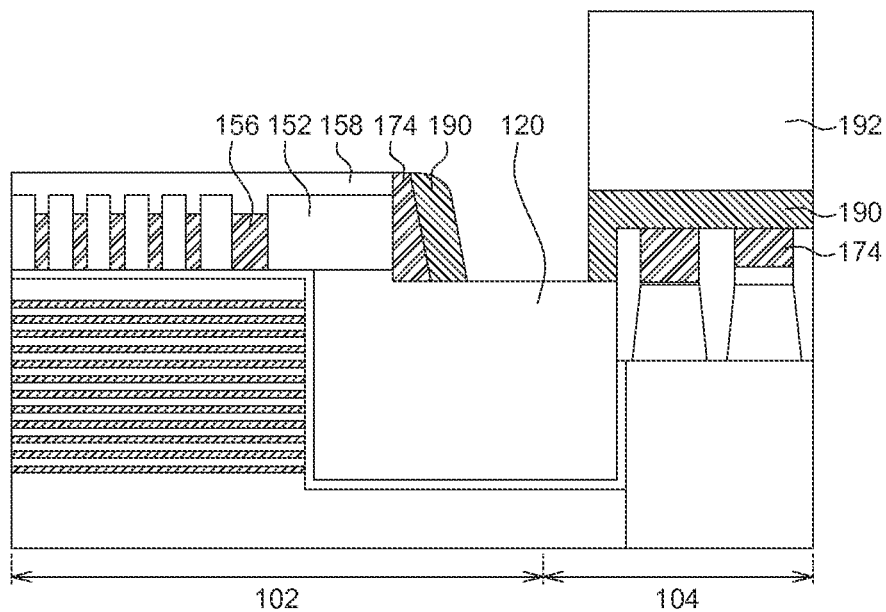

Referring to FIG. 30, a mask pattern 192 is formed covering the electrode layer 190 in the second region 104. In one embodiment, the mask pattern 192 comprises a photoresist material. A portion of the electrode layer 190 not covered by the mask pattern 192 is etched to remain the electrode layer 174 and the electrode layer 190 on the sidewall of the patterned layer 152 and protecting layer 158. This etching step may substantially stop on the exposed dielectric layer 120 and protecting layer 158.

Figure 31:
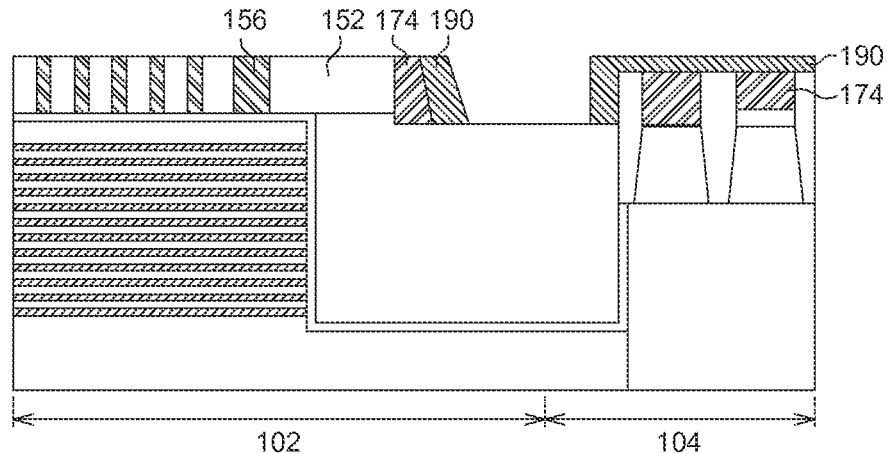

Referring to FIG. 31, the mask pattern 192 is removed. In addition, the protecting layer 158 on the gate electrode film 156, an upper portion of the electrode layer 174 and an upper portion of the electrode layer 190 are removed. These etching steps may be performed by CMP to make the etched elements have a substantial flat upper surface.

Figure 32:
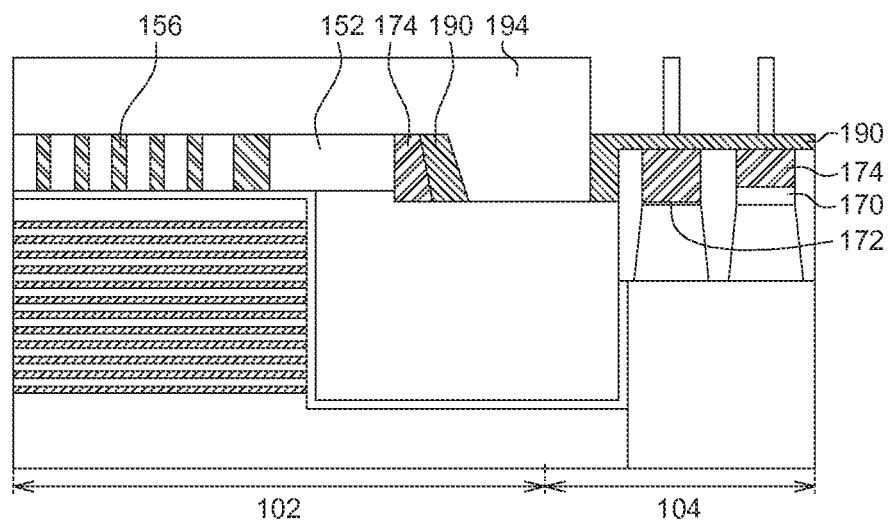

Referring to FIG. 32, a protecting layer 194 is formed on the dielectric layer 120, the patterned layer 152, the gate electrode film 156, the electrode layer 174 and the electrode layer 190 in the first region 102 so as to protect the elements in the first region 102 from being influenced by the processes applied in the second region 104, preserve the structure characteristics of the gate electrode film 156 (gate structure), the electrode layer 174 and the electrode layer 190. In one embodiment, the protecting layer 194 comprises a photoresist material.

Figure 33:
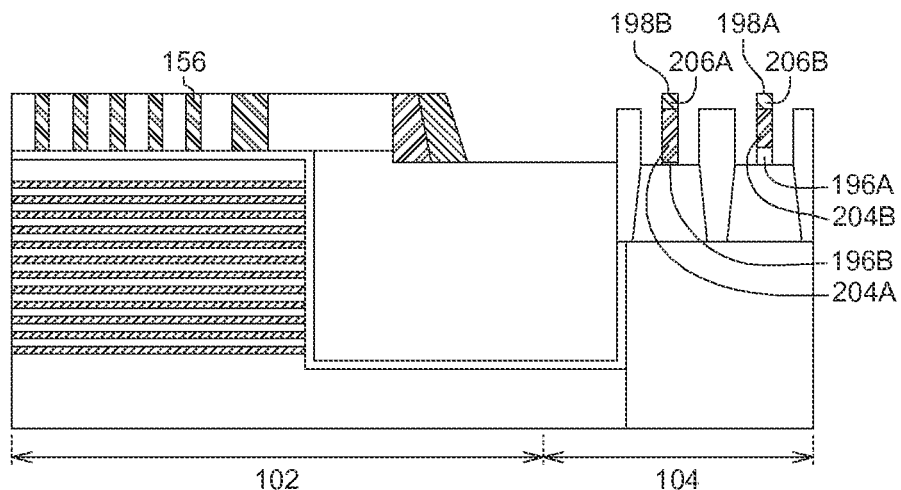

Referring to FIG. 33, portions of the electrode layer 190, the electrode layer 174, the dielectric layer 170 and the dielectric layer 172 not covered by the protecting layer 194 are removed to form a gate dielectric film 196A and a gate electrode film 198A of a gate structure in the first region 102, and a gate dielectric film 196B and a gate electrode film 198B of a gate structure in the second region 104. The gate electrode film 198A comprises a gate electrode film 204A and a gate electrode film 206A. The gate electrode film 198B comprises a gate electrode film 204B and a gate electrode film 206B. In one embodiment, the electrode layer 174 (FIGS. 23-32) for forming the gate electrode film 204A and the gate electrode film 204B is formed by a process with parameters different form parameters of a process which the electrode layer 190 (FIGS. 29-32) for forming the gate electrode film 206A and the gate electrode film 206B is formed by. Therefore, the gate electrode film 204A and the gate electrode film 206A have a grain boundary therebetween, and the gate electrode film 204B and the gate electrode film 206B have a grain boundary therebetween. In embodiments, the gate electrode film 156 in the first region 102 and the gate electrode film 198A and the gate electrode film 198B in the second region 104 are respectively formed by individual processes, therefore the gate electrode film 156 may have structure characteristics different form structure characteristics of the gate electrode film 198A and the gate electrode film 198B. For example, the structure characteristics may comprise different quantities of film layers or other conditions. Therefore, according to the manufacturing method in embodiments, it is possible to realize variable circuit designs according to actual demands. Next, the protecting layer 194 is removed.

Figure 34:
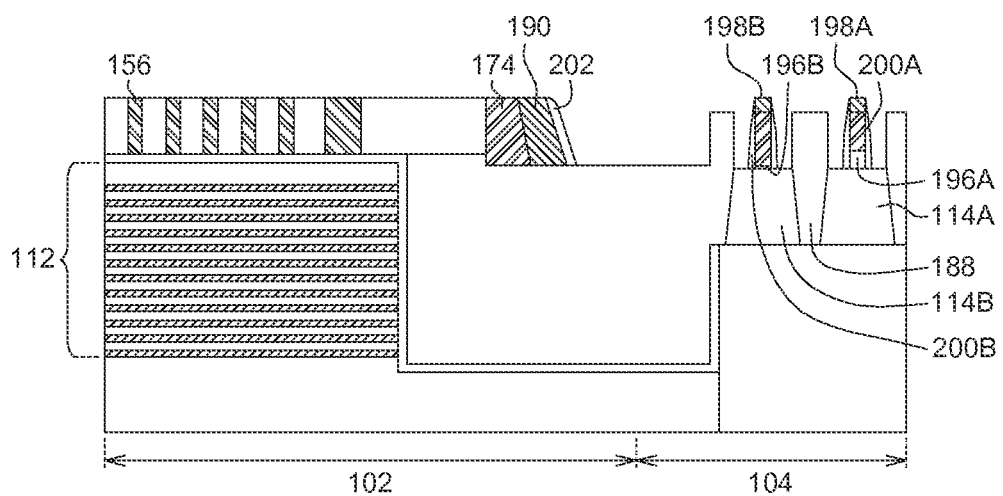

Referring to FIG. 34, a spacer 200A is formed on sidewalls of the gate dielectric film 196A and the gate electrode film 198B. A spacer 200B is formed on sidewalls of the gate dielectric film 196B and the gate electrode film 198B. A spacer 202 is formed on a sidewall of the electrode layer 190.

In one embodiment, the gate structures (gate electrode films 156) disposed on the stack structure 112 are used as word lines of the 3D stack memory. An upper surface of the isolation structure 188 is higher than upper surfaces of the semiconductor layer 114A and the semiconductor layer 114B. A thickness of the gate dielectric film 196A is bigger than a thickness of the gate dielectric film 196B. For example, the gate dielectric film 196A is a high-voltage oxide layer (HV GOX). The gate dielectric film 196B is a low-voltage oxide layer (LV GOX).

In embodiments, the 3D stack memory units comprise floating gate memories, charge capturing memories, or other non-volatile memories. The concepts in embodiments are not limited to devices of high density memory unit, but can be applied to other semiconductor circuit devices need integration of the damascene process and the self-aligned STI process, or integrations of other various kinds of processes.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method for a semiconductor structure, comprising:
    forming a first gate structure on a substrate in a first region;
    forming a protecting layer covering the first gate structure; and
    forming a second gate structure on the substrate in a second region exposed by the protecting layer and adjacent to the first region.

2. The manufacturing method for the semiconductor structure according to claim 1, further comprising removing the protecting layer after forming the second gate structure.

3. The manufacturing method for the semiconductor structure according to claim 1, wherein the second gate structure is formed on a first semiconductor layer, the method for forming the semiconductor structure further comprising:
    forming a third gate structure on a second semiconductor layer exposed by the protecting layer and adjacent to the first semiconductor layer; and
    forming an isolation structure between a sidewall of the first semiconductor layer and a sidewall of the second semiconductor layer before forming the second gate structure and the third gate structure.

4. The manufacturing method for the semiconductor structure according to claim 3, wherein the second gate structure and the third gate structure are formed by a method comprising:

forming a dielectric layer on the first semiconductor layer and the second semiconductor layer;
forming an electrode layer on the dielectric layer;
Forming a mask pattern on the electrode layer; and
removing a part of the dielectric layer and the electrode layer to form gate dielectric films and gate electrode films separated from each other by an etching step using the mask pattern as an etching mask, wherein the gate dielectric films and the gate electrode films respectively on the first semiconductor layer and the second semiconductor layer form the second gate structure and the third gate structure.

5. The manufacturing method for the semiconductor structure according to claim 3, wherein the first semiconductor layer, the second semiconductor layer and the isolation structure are formed by a method comprising:

forming a mask pattern on a third semiconductor layer;
removing a part of the third semiconductor layer to form the first semiconductor layer and the second semiconductor layer separated by a space by an etching step using the mask pattern as an etching mask; and
filling the space by an insulating material to form the isolation structure.

6. The manufacturing method for the semiconductor structure according to claim 5, further comprising:

forming a dielectric layer on the third semiconductor layer; and
forming an electrode layer on the dielectric layer, wherein the mask pattern is formed on the electrode layer, the removing step using the mask pattern as the etching mask simultaneously removing a part of the third semiconductor layer, the dielectric layer and the electrode layer to form the first semiconductor layer and the second semiconductor layer separated by the space, the etched electrode layers separated by the space, and the etched dielectric layers separated by the space.

7. The manufacturing method for the semiconductor structure according to claim 1, wherein the first gate structure is a plurality of the first gate structures separated from each other, the plurality of the first gate structures is formed by a method comprising:

forming a patterned layer having openings on the substrate; and
filling the openings of the patterned layers by a conductive layer to form the first gate structures.

8. The manufacturing method for the semiconductor structure according to claim 7, wherein the patterned layer is formed by a method comprising:

forming a sacrificial pattern having openings on the substrate; and
filling the openings of the sacrificial pattern by a material layer to form the patterned layer.

9. The manufacturing method for the semiconductor structure according to claim 8, wherein the sacrificial pattern is formed by a method comprising:

forming a sacrificial layer on the substrate;
forming a mask pattern having openings on the sacrificial layer; and
removing a part of the sacrificial layer to form the sacrificial pattern by an etching step using the mask pattern as an etching mask.

10. The manufacturing method for the semiconductor structure according to claim 9, wherein the mask pattern is formed by a method comprising:

forming a mask layer on the sacrificial layer;
forming a film pattern on the mask layer, wherein the film pattern has openings exposing the mask layer;
forming a material film on the film pattern and the mask layer exposed by the openings of the film pattern;
removing a part of the material film to remain a part of the material film on a sidewall of the film pattern to form material spacers;
removing the film pattern; and
removing a part of the mask layer to form the mask pattern by an etching step using the material spacers as etching masks.

11. The manufacturing method for the semiconductor structure according to claim 10, wherein the film pattern is formed by a method comprising:

forming a film layer on the mask layer;
forming a photoresist pattern on the film layer; and
removing a part of the film layer to form the film pattern by an etching step using the photoresist pattern as an etching mask.

12. The manufacturing method for the semiconductor structure according to claim 1, wherein the second gate structure is formed on a first semiconductor layer, the manufacturing method for the semiconductor structure further comprises:

forming a third gate structure on a second semiconductor layer; and
forming an isolation structure between a sidewall of the first semiconductor layer and a sidewall of the second semiconductor layer, wherein each of the second gate structure and the third gate structure is formed by a method comprises:
forming a gate dielectric film; and
forming a gate electrode film on the gate dielectric film, wherein the gate dielectric films of the second gate structure and the third gate structure have different thicknesses.

13. The manufacturing method for the semiconductor structure according to claim 1, further comprising:

stacking dielectric strips and conductive strips alternately to form a stack structure, wherein the first gate structure is formed on the stack structure, the second gate structure is formed on a semiconductor layer; and
forming a dielectric layer between a sidewall of the stack structure and a sidewall of the semiconductor layer.

\* \* \* \* \*